United States Patent [19]

Hardee

[11] Patent Number: 5,389,842

[45] Date of Patent: Feb. 14, 1995

[54] LATCH-UP IMMUNE CMOS OUTPUT DRIVER

[75] Inventor: Kim C. Hardee, Colorado Springs, Colo.

[73] Assignees: Nippon Steel Semiconductor Corporation, Toky, Japan; United Memories, Inc., Colorado Springs, Colo.

[21] Appl. No.: 927,615

[22] Filed: Aug. 10, 1992

[51] Int. Cl.$^6$ ............... H03K 17/10; H03K 19/0948
[52] U.S. Cl. .................................. 327/391; 327/379
[58] Field of Search .................. 307/270, 572, 579

[56] References Cited

U.S. PATENT DOCUMENTS

| | | | |
|---|---|---|---|
| 4,039,869 | 8/1977 | Goldman et al. | 307/304 |
| 4,475,050 | 10/1984 | Noufer | 307/579 X |
| 4,584,491 | 4/1986 | Ulmer | 307/579 X |
| 4,707,625 | 11/1987 | Yanagisawa | 307/579 X |
| 4,740,713 | 4/1988 | Sakurai et al. | 307/579 X |
| 5,057,715 | 10/1991 | Larsen et al. | 307/451 |
| 5,220,221 | 6/1993 | Casper | 307/572 X |

*Primary Examiner*—Willis R. Wolfe
*Attorney, Agent, or Firm*—Edward D. Manzo

[57] ABSTRACT

An output driver for a CMOS circuit minimizes latch-up. A P-channel transistor (14) has its source-drain path coupled in series with the source-drain path of one or more N-channel transistors (16, 12). An internally generated high voltage VCCP, higher than VCC, is applied to the moat, well, or region in which the P-channel transistor is formed, and is applied to the gate electrode of the N-channel transistor(s). In one embodiment (FIG. 3), the source of the P-channel transistor is connected directly to VCC whereas in another embodiment (FIGS. 1A/1B), it is coupled to the source-drain path of another N-channel transistor, the gate electrode of which is coupled to the high voltage VCCP. In such second embodiment, the drain of the second N-channel transistor is coupled to VCC, so that the P-channel transistor is in series between the two N-channel transistors. One of the N channel FETs may receive at its gate electrode either a constant high voltage (VCCP) despite changes in the logic state of the data input signal (FIG. 1A), or it may correspond inversely therewith (FIG. 1B).

13 Claims, 2 Drawing Sheets

LATCH-UP IMMUNE CMOS OUTPUT DRIVER

FIELD OF THE INVENTION

The present invention relates to solid state circuitry, integrated circuitry, and especially to overcoming latch-up problems in complementary metal oxide semiconductor (CMOS) circuitry. The present invention provides an output driver circuit that avoids or minimizes latch-up.

BACKGROUND OF THE INVENTION

The problem of latch-up is a concern in the operation of integrated circuit devices that use CMOS technology. A description of latch-up in CMOS circuitry is given in Eaton, Jr. U.S. Pat. No. 4,571,505 entitled METHOD AND APPARATUS OF REDUCING LATCH-UP SUSCEPTIBILITY IN CMOS INTEGRATED CIRCUITS, issued Feb. 18, 1986 to INMOS Corporation of Colorado Springs, Colo., which patent is incorporated herein by reference and to which attention is invited for reference. Generally, latch-up results from (usually parasitic) devices such as PNP and NPN transistors that are formed unintentionally and which respond to such events as rapid changes in power supply voltage, light, radiation, input and output over-voltage, and on-chip capacitive disturbances.

In driving an output node or pin of an integrated circuit to a full power supply level (such as may be referred to as "VCC"), the prior art has heretofore used a P-channel transistor with its gate electrode driven from VCC to zero volts, or an N-channel transistor with its gate electrode driven from zero volts to some voltage above VCC. A bootstrapped driver can be used to achieve such elevated voltage. If the P-channel transistor is used, then latch-up may occur if the output is forced above VCC. If an N-channel transistor is used, then a speed loss and/or reliability problem can occur due to the need to drive the gate electrode to a voltage above VCC. Also, even with the gate electrode of the N-channel transistor at zero volts, if the output is forced to a negative voltage (such as −1.0 volt), the transistor will turn on, causing substrate current and possible reliability problems.

The aforesaid Eaton U.S. Pat. No. 4,571,505 provided a method and apparatus which involved a circuit for sensing a power supply transition, clamping the substrate to ground in response to sensing the transition, and thereafter releasing the clamp.

SUMMARY OF INVENTION

Instead of employing a single N-channel or P-channel transistor for the pull-up portion of an output driver, the present invention in a preferred one of its embodiments uses two N-channel transistors and one P-channel transistor connected in series between the two N channel transistors. Through certain connections, the combination protects against latch-up because the P+ source and drain regions of the P-channel transistor can never be forced above VCCP-VTN, where VCCP is an internal voltage supply which is above VCC and VTN is the threshold voltage of an N-channel transistor. The body or well of the P-channel transistor is tied to VCCP, so the P+ or N− source and drain junctions will never be forward biased. Hence latch-up will not occur.

When the gate of the P-channel transistor is driven to VCC, it is off and even if the output is forced to a negative voltage (undershoot), the N-channel transistors will not turn on. Therefore, no substrate current will be generated.

VCCP is preferably generated on-chip with a pump circuit and needs to be higher than VCC+VTN for the output to be driven to a full VCC level.

In the most preferred embodiment, the three transistors can be referred to as a "top" or "upper" transistor, a middle transistor, and a bottom transistor. The top transistor is an N-channel field effect transistor (FET) with its drain electrode coupled to VCC (an externally generated power supply voltage), its gate electrode coupled to VCCP, and its source electrode coupled to the source-drain path of the middle transistor. The middle transistor is a P-channel FET, and the source electrode of the top N-channel transistor is thus coupled to the source electrode of the P-channel transistor. The gate electrode of the P-channel transistor is driven between zero volts and VCC. Its drain electrode is coupled to the drain electrode of the lower N-channel transistor. The lower (N-channel) transistor has its gate electrode coupled to VCCP and its source electrode coupled to the output.

Preferably, the top N-channel transistor is as large as possible, and the other transistors are sized to drive the output load. The body or N well of the P-channel transistor is coupled to VCCP.

BRIEF DESCRIPTION OF THE DRAWINGS

In describing the preferred embodiments, reference is made to accompanying drawings wherein like parts have like reference numerals and wherein.

DETAILED DESCRIPTION OF THE PREFERRED EMBODIMENT

Figure 1A:
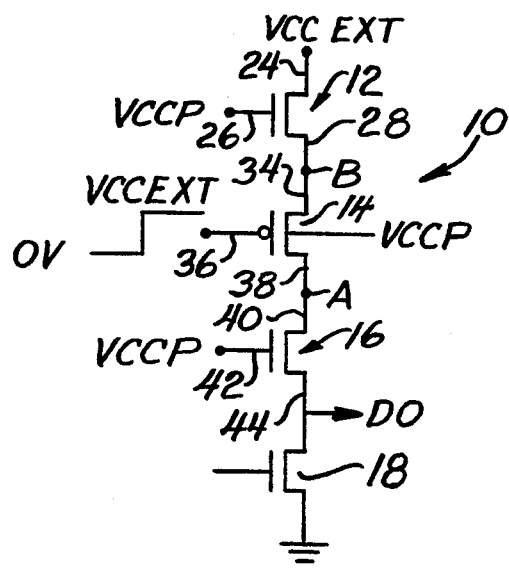
FIG. 1A represents one schematic diagram of a preferred embodiment of the present invention.

Referring to FIG. 1A, an output driver circuit 10 comprises a plurality of transistors shown as field effect transistors (FETs). Accordingly, each of them has a source electrode, a gate electrode over a gate region, and a drain electrode. The conductivity of the source-drain path is modulated or controlled by the gate electrode voltage. As shown in FIG. 1A, circuit 10 comprises transistors 12, 14, 16, and 18. Of these, transistor 14 is a P-channel device whereas the others are N-channel devices. It will be seen that the source-drain paths of these transistors are coupled in series between an externally generated power supply voltage called VCC EXT, connected at the drain electrode of transistor 12, and a ground connection, sometimes called VSS, coupled to the source electrode of transistor 18.

A data output, which has been marked DO is taken from a node or point between the drain electrode of transistor 18 and the source electrode of transistor 16. The voltage at data output DO is pulled low (towards ground) whenever or to the extent that transistor 18 is turned on. Also, the output DO is pulled toward VCC EXT whenever transistors 12, 14 and 16 are on, and preferably transistor 18 is turned off. Of course, if all of the transistors 12 through 18 are turned on, the data output will have some voltage intermediate VCC EXT and VSS.

An N-channel FET turns on when the gate electrode voltage is high relative to the source voltage by at least one N-channel threshold voltage $Vt_N$. A P-channel FET is turned on when its gate electrode voltage is at least one P-channel threshold voltage $Vt_P$ below the source voltage.

In FIG. 1A, a first node A is located electrically between the drain electrode of transistor 16 and the drain electrode of P-channel transistor 14. A second node B is located between the source electrode of transistor 12 and the source electrode of transistor 14.

Various parts of circuit 10 are connected to receive a voltage VCCP. That voltage is an internally generated voltage which is higher in voltage than VCC. Illustratively, where VCC is nominally 3.3 volts, VCCP may be 5.0 volts. The general rule for choosing VCCP is that VCCP must be at least VCC EXT+$VT_N$, but not so high as to cause reliability problems. As seen in FIG. 1A, VCCP is applied to the gate electrodes of N-channel transistors 12 and 16. Additionally, that same voltage VCCP is coupled to the substrate or well in which P-channel transistor 14 is constructed.

The gate electrode of P-channel transistor 14 is coupled to receive a signal between zero volts and VCC EXT. That is the data signal which is to be driven to the output pin. Illustratively, that voltage may come from a buffer or other parts of a memory circuit with which the output driver is associated or of which it is a part.

The gate electrode of transistor 18 is coupled to receive a signal (not shown) which is effective to turn transistor 18 off when data is to be outputted to a high level, and to turn transistor 18 on when data having a low value is to be outputted. Illustratively, the voltage applied to the gate electrode of transistor 18 may be the same as or move parallel to the signal applied to the gate electrode of transistor 14. At a gate electrode voltage of zero volts, transistor 14 will turn on (because the gate voltage will be more than one Vt below the voltage at node B—its source—which has a voltage near VCC EXT). Since this is the condition that tends to drive the output node DO toward VCC EXT, it is preferred that this "pull-up" action not be offset by any "pull-down" through FET 18. Hence, to turn FET 18 off, where FET 18 is an N-channel device, its gate electrode should be a zero volts—and that corresponds to the voltage applied to the gate electrode of transistor 14.

Inversely, if the data output is to be driven to a low voltage, at least one of the pull-up transistors such as FET 14 should be turned off and FET 18 should be turned on. This will occur conveniently by raising the voltage at the gate electrode of each of those two transistors. It will be appreciated therefore that transistor 14 may be referred to as a "pull-up" transistor and transistor 18 may be referred to a "pull-down" transistor.

Figure 1B:
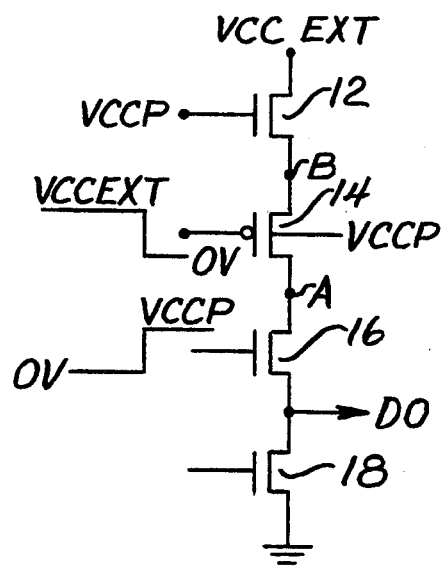
FIG. 1B shows the same circuit as FIG. 1A with slightly different signals or voltages applied thereto as permitted by the present invention.

FIG. 1B shows the same driver circuit 10 but with slightly different connections. The structure is identical, but the different connections are that the gate electrode of the P channel transistor 14 is coupled to receive the inverse of the signal applied thereto in FIG. 1A. That is, instead of receiving a low to high transition from 0 volts to VCC EXT, it receives a downward going transition from VCC EXT to 0 volts, while N channel transistor 16 preferably simultaneously or concomitantly (although sequential transitions may occur at the expense of time) receives an upward going transition from 0 volts to VCCP, when the data output signal DO is to be driven high. It will be understood that with transistors 12, 14, and 16 having their gate electrodes coupled to receive voltages of VCCP, VCC EXT, and 0, respectively, transistor 12 is on, transistor 14 is off, and transistor 16 is off. Thus, even though transistor 18 may be on to pull down the DO output node, current does not flow from the path from the drain of FET 12 (VCC EXT) to the data output node. But when the two transitions occur as schematically represented in FIG. 1B, so that FETs 12, 14, and 16 receive gate electrode voltages of VCCP, 0, and VCCP, then FET 12 will be on (still), FET 14 will turn on, and FET 16 also will turn on. It is to be understood that transistor 18 is to be shut off to terminate the pull-down of the data output node DO toward ground via the source-drain path of FET 18.

The FIG. 1B configuration is a compromise which remedies one concern, namely, that is N channel FET 16 is left on all the time, as in FIG. 1A, there is extra capacitance on the output node. But with FET 16 switched off by applying 0 volts to the gate electrode, then the extra capacitance on the output node DO is removed or reduced. This approach may have some of the same problems as FIG. 6 infra but it would not have the substrate current problem since the P channel FET 14 would also be turned off.

Figure 2:
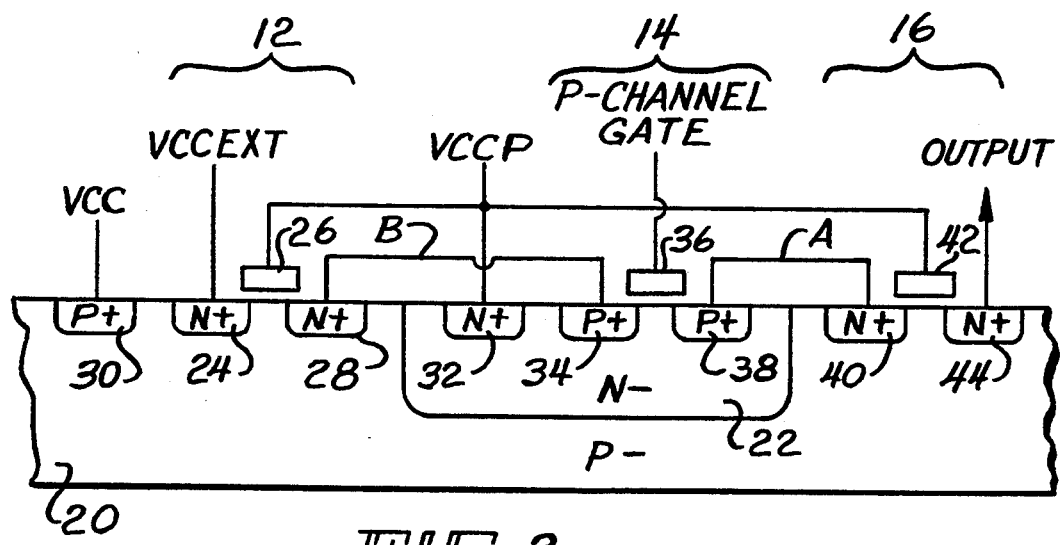
FIG. 2 is a schematic cross-sectional representation of the pull-up portion of the FIG. 1 circuit.

FIG. 2 is a sectional view of transistors 12, 14 and 16 in one embodiment. In FIG. 2, a region 20 is shown as being doped P−. Region 20 may comprise a substrate, an epitaxial layer, a well, moat, or any other region of an integrated circuit device. The region 20 may be doped with a P type impurities, usually boron, to a relatively light concentration.

Within region 20 is a further region 22 which is indicated to have an N-doping. Illustratively, region 22 may be doped lightly with phosphorus or arsenic. Region 22 may be referred to as a "region," "moat," or "well." It will be appreciated that the N-channel transistors 12 and 16 will be formed within and above region 20, but outside region 22, and P-channel transistor 14 will be formed in and above region 22.

With respect to transistor 12, source and drain regions 24, 28 are shown as N+ regions within region 20. A gate electrode 26 is shown over the upper surface of region 20. Gate electrode 26 may be formed of polysilicon, a polycide, a metal conductor, or another conductive material as is commonly used in integrated circuit fabrication. (It will be understood that pad oxides below the gate electrodes, isolation oxide or other isolation mechanisms, interlevel dielectric, and passivation, as well as other regions normally seen in a cross-sectional view of an integrated circuit, are not shown in FIG. 2 but have been omitted for promoting the clarity of the illustration. The skilled artisan will also understand that the gate electrodes and all other regions have some depth to them, and could extend significantly.) Other source and drain regions, as well as the gate electrodes, are formed of similar materials as the source, drain, and gate electrode for transistor 12.

To the left of transistor 12 in FIG. 2 there is shown a diffusion or region 30 having an impurity of P+. That is, it may be doped to a higher concentration, of a Group III impurity such as boron, than the concentration of impurities within region 20. Region 30 is connected to VBB which is a back bias voltage. Thus, where region 20 is a substrate, it will be seen that the substrate receives a back bias voltage. This back bias voltage adjusts the N channel threshold voltages and allows the input and output pins of the device (e.g. the memory device) to go to negative voltages without causing latch-up. VBB is a negative voltage of illustratively −2.0 volts and typically is generated on-chip.

Region 24 is connected to receive a power supply voltage VCC EXT which is provided externally in the preferred embodiment. Gate electrode 26 is coupled to receive the voltage VCCP as shown in FIG. 2 by a representative conductive line.

Turning now to the N− region 22, transistor 14 is formed by a P+ region 34, a gate electrode 36 located over the upper surface of region 22, and a P+ region 38 within region 22. Region 34 is the source electrode of transistor 14 and is connected to N+ region 28 by a representative conductive line. Gate electrode 36 is coupled to receive the data or other signal to be outputted from the integrated circuit. However, it is an input to the driver and may therefore be referred to as an "input."

It will be seen that within region 22, an N+ diffusion or region 32 has been constructed. This region 32 is a heavily doped, preferably arsenic or phosphorus region that is electrically coupled to receive the voltage VCCP.

At the right side of FIG. 2, an N+ region 40 can be seen. This constitutes the drain electrode of transistor 16 and is coupled electrically by a representative (conductive) line over the upper surface of region 20 to the drain region 38 of transistor 14. A gate electrode 42 is shown over the upper surface of region 20. A source electrode is formed by an N+ region 44 within region 20. Region 44 is coupled by a representative (conductive) line to provide the output signal of the integrated circuit device.

It will be understood that a channel region, sometimes called a "gate," is formed between regions 24 and 28, and that gate electrode 26 is located above that channel region. Likewise, a second channel region is formed between regions 34 and 38, and gate electrode 36 is located above that channel region. Similarly, a channel region is formed between regions 40 and 44, with gate electrode 42 located above that third channel region.

The described structure should protect the P-channel transistor 14 during power-up and output overshoot. Overshoot occurs if region 44 reaches an excessively high voltage. In this configuration, neither node A nor node B can be driven above VCCP-VTN. The N− well 22 for PMOS transistor 14 is tied (coupled) to VCCP (via region 32), and VCCP is a voltage higher than VCC (higher than VCC EXT). Because of this VCCP voltage, no P+/N− junctions will ever be forward biased. Such P+/N− junctions occur at the interface between region 22 and regions 34 or 38.

The reason that node B cannot be above VCCP-VTN is that node B must always be one N-channel threshold voltage below the gate voltage of transistor 12. Otherwise, transistor 12 would not turn on. Since the gate electrode of transistor 12 receives VCCP, then node B necessarily is no higher than VCC-VTN.

The reason that node A cannot be above VCCP-VTN is that node A must always be one N-channel threshold voltage below the gate voltage of transistor 16. Otherwise, transistor 16 would not trun on. Since the gate electrode of transistor 16 receives VCCP, then node A necessarily is no higher than VCCP-VTN.

Therefore, it will be appreciated that by interposing an N-channel transistor between the source-drain path of the P channel transistor and the power supply voltage (VCC EXT), latch-up is controlled. Preferably, a further N-channel transistor is located on the other side of the P channel transistor, so that its source-drain path is between the source-drain path of the P channel transistor and the output electrode.

Figure 3:
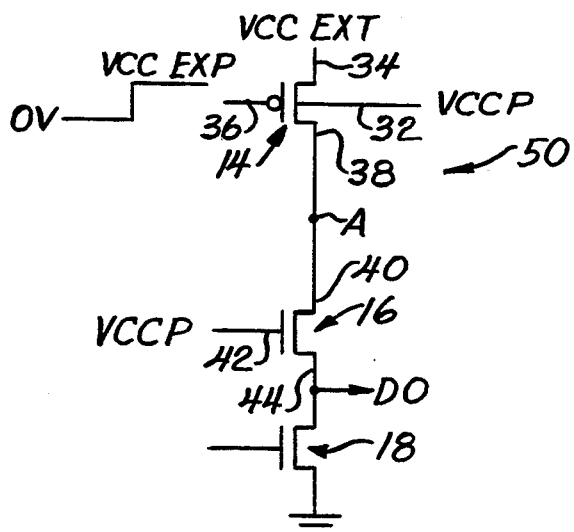
FIG. 3 is an alternate circuit.

FIG. 3 represents another output driver circuit 50 which differs from circuit 10 in that it lacks transistor 12. This circuit protects the PMOS transistor 14 from output overshoots since node A cannot be driven above VCCP-VTN by the output pin coupled to output DO. (The reason for this is that the voltage drop from source 44 to drain 40 must be at least VCCP-VTN.) However, during power-up, VCC EXT will rise before VCCP ( preferably but not necessarily internally generated), and a latch-up condition may occur.

Figure 4:
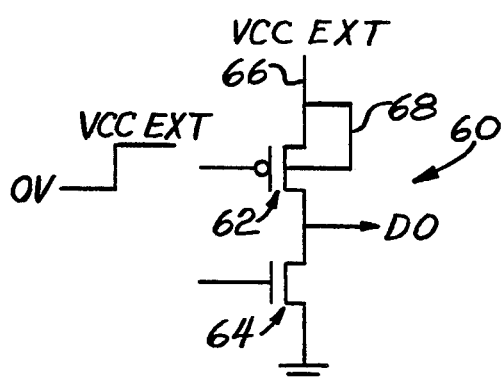
FIG. 4 is another alternate circuit.

FIG. 4 represents a simpler approach to an output driver 60. It comprises a PMOS transistor 62 coupled in series with an N-channel transistor 64. The source 66 of PMOS transistor 62 is coupled to receive VCC EXT, and that same electrode is coupled to the well, moat, or region in which that P channel (PMOS) transistor is formed as indicated at 68. The gate electrode of PMOS transistor 62 is coupled to the data signal which transitions from zero volts to VCC EXT to turn transistor 62 on and off, respectively. The data output DO is taken from a node between the drain electrodes of transistors 62 and 64. Transistor 64 is similar to transistor 18 of FIG. 1A and is an N-channel device. Driver 60 has the problem of forward biasing a P+/N− diode if the output pin to which DO is connected is forced to a voltage greater than one VD above VCC EXT, where VD denotes a P+/N− diode drop of about 0.6 volts. A vertical PNP transistor would turn on which would dump current into the P type substrate (VBB).

Figure 5:
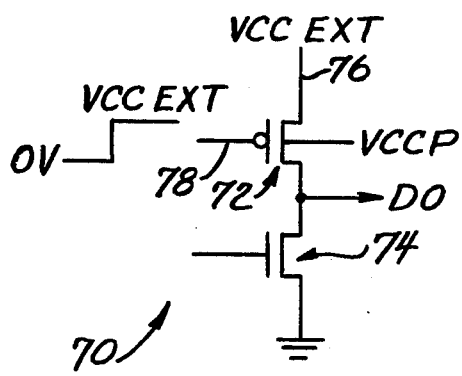
FIG. 5 is still another alternate circuit.

A fourth output driver circuit 70 is illustrated in FIG. 5. It comprises a P-channel transistor 72 coupled in series with an N-channel transistor 74. The data output DO is taken from the node between them. The source electrode 76 of transistor 72 is coupled to VCC EXT and the well, moat, or region in which the P-channel transistor 72 is formed is coupled to VCCP, which is the same voltage as described above. The gate electrode 78 is coupled to receive the data signal which transitions between zero volts and VCC EXT. Circuit 70 solves the problem of circuit 60. However, the internal voltage VCCP must be 7.5 volts or more where VCC EXT is 5.5 volts. If DO is forced above VCCP, the vertical PNP transistor will still turn on. Another problem is that during power-up, VCC EXT will rise before VCCP since VCCP is an internally pumped voltage. This could cause latch-up.

Figure 6:
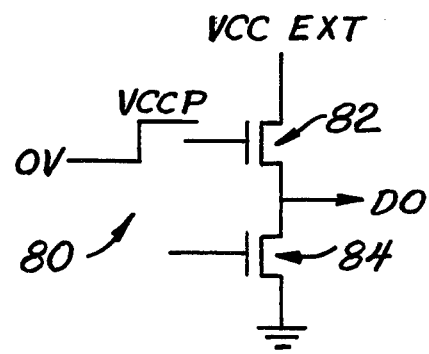
FIG. 6 is yet another alternate circuit.

A fifth output driver 80 illustrated in FIG. 6 represents yet another approach. It uses two N-channel transistors 82 and 84 which are coupled in series. The drain of transistor 82 is coupled to VCC EXT and the source of transistor 84 is coupled to ground (VSS). The data output is taken from the node between the two transistors. The gate electrode of transistor 82 transitions from zero volts to VCCP, which is higher than VCC EXT, thereby able to drive DO to an output voltage of VCCP-VTN. This eliminates the problems described above. However, VCCP must be generated by a boot-strapped driver or by a pump circuit which is able to keep up with random output transitions. This approach results in extra current being drawn out of VCCP, which results in a much larger VCCP pump being required.

It is preferred to use circuit 10 shown in FIG. 1A from among all of these circuits since it gives the greatest protection against latch-up. However, in given applications, less complex circuits may be desired and used, as illustrated within the present specification. The present specification is intended to be illustrative, and various alterations or substitutions can be made without departing from the spirit and scope of the present invention. For example, it will appreciated that transistor 18 (as well as 64, 74, and 84) may take other forms. The main function is to provide a way to pull down the output signal DO effectively to VSS to represent one of the two binary states of a data output signal. The invented circuitry avoids the problems mentioned earlier in the specification and allow an output to be driven to a full VCC level. Indeed, the output can be forced above VCC or below VSS without risk of latch-up and without causing substrate current. This would be useful in a system where three volt and five volt parts are interfacing with each other and/or where undershoot is a problem.

Preferred sizes for the devices of the preferred circuit 10 in FIG. 1A are given in the following Table I where the length and width are given in micrometers (microns):

TABLE I

| DEVICE | LENGTH | WIDTH |
|---|---|---|
| transistor 12 | 0.8 | 2000 |
| transistor 14 | 1.2 | 1200 |
| transistor 16 | 0.8 | 400 |
| transistor 18 | 0.8 | 400 |

I claim:

1. An output driver in an integrated circuit comprising:
    an N-channel transistor and a P-channel transistor, each having a respective gate electrode and source-drain path, the source-drain paths of said transistors being coupled in series and having a node (A) therebetween, the source-drain paths being in circuit between an externally generated first supply voltage and the second voltage;
    a data output path coupled to said circuit between the first supply voltage and the second voltage;
    the gate electrode of the P-channel transistor being coupled to receive a data signal,
    the gate electrode of the N-channel transistor being coupled to receive a high voltage, said high voltage being greater than said first supply voltage;
    said high voltage being coupled to a region in which said P-channel transistor is constructed and
    wherein the source-drain path of the N-channel transistor is located between the data output path and the P-channel transistor.

2. The output driver of claim 1 wherein said N-channel transistor comprises a first N-channel transistor and further comprising:
    a second N-channel transistor having a respective gate electrode and source-drain path, said source-drain path of said P-channel transistor being coupled in series between said source-drain paths of said first and second N-channel transistors so that said three, series-connected source-drain paths are in circuit between said first supply voltage and said second voltage,
    the gate electrode of said second N-channel transistor being coupled to receive said high voltage.

3. The output driver according to claim 2 wherein said first supply voltage is coupled to the drain electrode of said second N-channel transistor, and wherein said output path is selectively coupled to said second voltage.

4. The output driver according to claim 3 further comprising a transistor circuit (18) selectively coupling said output path to said second supply voltage.

5. The output driver according to claim 4 wherein said transistor circuit includes another N-channel transistor (18) having a source-drain path coupled between said output path and said second supply voltage, said another N-channel transistor having a gate electrode coupled to receive a signal to couple said output path to said second supply voltage when the data input is at one level, and to decouple the output path from said second supply voltage when the data output is at a second voltage.

6. The output driver of claim 2 wherein said first N channel transistor (16) is coupled to receive constantly said high voltage.

7. The output driver of claim 2 wherein said first N channel transistor (16) is coupled to receive said high voltage selectively, based upon the data in accordance with which the data output path is to be driven.

8. A method of reducing latch-up in an output driver for a CMOS circuit comprising the steps of:
    coupling a source-drain path of a P-channel transistor in series with the source-drain path of an N-channel transistor,
    coupling said series-connected source-drain paths in circuit with a first power supply voltage and a second voltage;
    generating a high voltage which is higher than said first power supply voltage, and coupling said high voltage to the gate electrode of said N-channel transistor and to the well, moat, or region in which the P-channel transistor is formed;
    applying a data input signal which is to form the basis of the output signal to the gate electrode of the P-channel transistor; and
    deriving an output signal from the circuit path between the first power supply voltage and the second supply voltage.

9. The method according to claim 8 wherein said high voltage is coupled selectively to the gate electrode of the N channel transistor, in accordance with the data input signal, thereby to permit the N channel transistor to turn on when the output signal is to be driven to a selected one of two states.

10. The method of claim 9 wherein the voltage applied to the gate electrode of the N channel transistor corresponds inversely with the data input signal.

11. The method of claim 10 further comprising coupling a second N channel transistor so that its source-drain path is in series with said first-named N channel transistor and said P channel transistor, and constantly applying said high voltage to said second N channel transistor despite changes in the logic state of the data input signal.

12. The method of claim 8 wherein said step of applying a high voltage to said N channel transistor comprises coupling said high voltage constantly despite changes in the logic state of the data input signal.

13. The method of claim 12 further comprising coupling a second N channel transistor so that its source-drain path is in series with said first-named N channel transistor and said P channel transistor, and applying said high voltage to said second N channel transistor constantly despite changes in the logic state of the data input signal.

* * * * *